United States Patent [19]

Foo

[11] Patent Number: 5,429,134
[45] Date of Patent: Jul. 4, 1995

[54] MULTI-PHASE FAT SUPPRESSED MRI CARDIAC IMAGING

[75] Inventor: Thomas K. Foo, Waukesha, Wis.

[73] Assignee: General Eelctric Company, Milwaukee, Wis.

[21] Appl. No.: 266,295

[22] Filed: Jun. 27, 1994

[51] Int. Cl.⁶ .............................................. A61B 5/055
[52] U.S. Cl. ................................. 128/653.2; 324/307; 324/309
[58] Field of Search ...................... 128/653.2; 324/307, 324/309

[56] References Cited

U.S. PATENT DOCUMENTS

| | | | |
|---|---|---|---|
| 4,746,864 | 5/1988 | Satoh | 324/309 |
| 5,000,182 | 3/1991 | Hinks | 128/653.1 |
| 5,031,624 | 7/1991 | Mistretta et al. | 324/306 |
| 5,070,876 | 12/1991 | Wright | 128/653.3 |
| 5,233,991 | 8/1993 | Wright | 128/653.2 |
| 5,250,899 | 10/1993 | Listerud et al. | 324/309 |
| 5,256,967 | 10/1993 | Foo et al. | 324/311 |
| 5,270,652 | 12/1993 | Dixon et al. | 128/653.2 |
| 5,285,158 | 2/1994 | Mistretta et al. | 324/309 |
| 5,320,099 | 6/1994 | Roberts et al. | 324/309 |
| 5,329,925 | 7/1994 | NessAiver | 128/653.2 |

OTHER PUBLICATIONS

*Fast Spiral Coronary Artery Imaging,* C. H. Meyer, et al., Magnetic Resonance in Medicine 28, 202–213 (1992).

*Ultrafast Interleaved Gradient-Echo-Planar Imaging on a Standard Scanner,* G. C. McKinnon, MRM 30:609–616 (1993).

*Coronary Arteries: Three-dimensional MR Imaging with Fat Saturation and Magnetization Transfer Contrast*[1], Debiao Li, et al., Radiology 1993; 187:401–406.

*Human Coronary Arteries: Projection Anglograms Reconstructed from Breath-hold Two-dimensional MR Images*[1], Robert R. Edelman, et al., Radiology 1993; 187:719–722.

Primary Examiner—Lee S. Cohen
Assistant Examiner—Brian L. Casler
Attorney, Agent, or Firm—Quarles & Brady

[57] ABSTRACT

Fast NMR pulse sequences are employed to acquire data in a single breath-hold from which a plurality of cardiac phase images are reconstructed. Signals from fat are suppressed by frequency selective RF inversion pulses applied just prior to each group of fast NMR pulse sequences.

11 Claims, 3 Drawing Sheets

MULTI-PHASE FAT SUPPRESSED MRI CARDIAC IMAGING

BACKGROUND OF THE INVENTION

The field of the invention is nuclear magnetic resonance imaging methods and systems. More particularly, the invention relates to the production of temporal phase images in a fast cardiac MRI acquisition capable of being acquired in a single breath-hold.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Most NMR scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences which have a very short repetition time (TR) and result in complete scans which can be conducted in seconds rather than minutes. When applied to cardiac imaging, for example, a complete scan from which a series of images showing the heart at different phases of its cycle can be acquired in a single breath-hold as described in co-pending U.S. patent application Ser. No. 102,166, filed on Aug. 4, 1993 and entitled "MRI Cardiac Image Produced By Temporal Data Sharing".

The number of cardiac phase images that can be acquired during a scan is determined by a number of factors such as pulse sequence repetition time, the number of views acquired at each cardiac trigger and the patient's heart rate. By decreasing the number of views acquired at each cardiac trigger, more phase images can be acquired and the "temporal resolution" of the series of cardiac images is increased. However, total scan time is also increased because the number of cardiac triggers required to complete the acquisition of each phase image is increased.

Coronary arteries are usually surrounded by pericardial fat. The high NMR signal produced by this fat can at times obscure the NMR vascular signal which is of most interest to the clinician. To improve the detectability of the coronary arteries, therefore, it is desirable to utilize a fat suppression sequence such as that disclosed in U.S. Pat. No. 5,256,967 issued on Oct. 26, 1993 and entitled "Fast NMR Image Acquisition With Spectrally Selective Inversion Pulses". Unfortunately, such fat suppression pulse sequences significantly increase the time required to acquire each set of views, resulting in fewer cardiac phase images or a longer scan time.

SUMMARY OF THE INVENTION

The present invention is a method for acquiring a set of cardiac phase images which may, if desired, be acquired within a single breath-hold in which the signal produced by fat is suppressed. More specifically, the present invention includes: producing a cardiac signal which indicates the patient's cardiac cycle; executing groups of fast NMR pulse sequences during each cardiac cycle, preceding each group of fast NMR pulse sequences with a frequency selective RF inversion pulse that suppresses the NMR signal produced by fat during the subsequent group of fast NMR pulse sequences; and reconstructing a cardiac phase image from NMR data acquired by each of said groups of fast NMR pulse sequences during a succession of cardiac cycles. The time required to execute the fat suppressed groups of fast NMR pulse sequences during each cardiac cycle is reduced by altering the flip angle of the first RF inversion pulse during each cardiac cycle to reduce the delay time (TI) for the fat magnetization to pass through zero, and by varying the flip angle of the RF excitation pulses in each group of fast NMR pulse sequences to eliminate the need for time consuming dummy RF excitation sequences to establish a steady-state prior to each group of fast NMR pulse sequences.

A general object of the invention is to employ a fat suppression sequence in a fast, multi-phase, cardiac acquisition in which the scan time is short enough to acquire images in a single breath-hold. By recognizing that the longitudinal magnetization of fat is different for the first group of fast NMR pulse sequences during each cardiac cycle, the associated frequency selective RF inversion pulse is tailored such that the magnetization passes through zero at the same delay time (TI) as with the subsequent groups of fast NMR pulse sequences. Fat is thus suppressed without increasing the delay time (TI) for the first group.

Another object of the invention is to shorten the time required to acquire the fat suppressed NMR signal in each group of fast NMR pulse sequences. This is accomplished by eliminating the need for dummy RF excitation sequences used to stabilize the magnetization prior to data acquisition. Instead, signal stabilization is achieved by varying the flip angles of the RF excitation pulses in each of the successive fast NMR pulse sequences, and by using an offset segmented, interleaved view acquisition order that minimizes the effect of the remaining unequal k-space signal magnitude.

Yet another object of the invention is to reduce image artifacts due to phase shifts caused by gradient field induced eddy currents. Even though the fast NMR pulse sequences are executed only during a part of each cardiac cycle, it has been discovered that image artifacts can be reduced by "playing" the gradient field pulses continuously throughout the cardiac cycle. The eddy currents which these gradient pulses induce in conductive structures are thus relatively constant, and any phase shifts they may produce in the acquired NMR signals is also relatively constant from view-to-view and cardiac phase image-to-cardiac phase image.

Yet another object of the invention is to increase the number of cardiac phase images that can be acquired in a fast acquisition sequence capable of being completed in a single breath-hold. By reducing the time required to a acquire a fat suppressed data segment, view sharing as described in copending U.S. patent application Ser. No. 102,166 and entitled "MRI Cardiac Image Produced By Temporal Data Sharing" may be employed.

DESCRIPTION OF THE PREFERRED EMBODIMENTS

Figure 1:
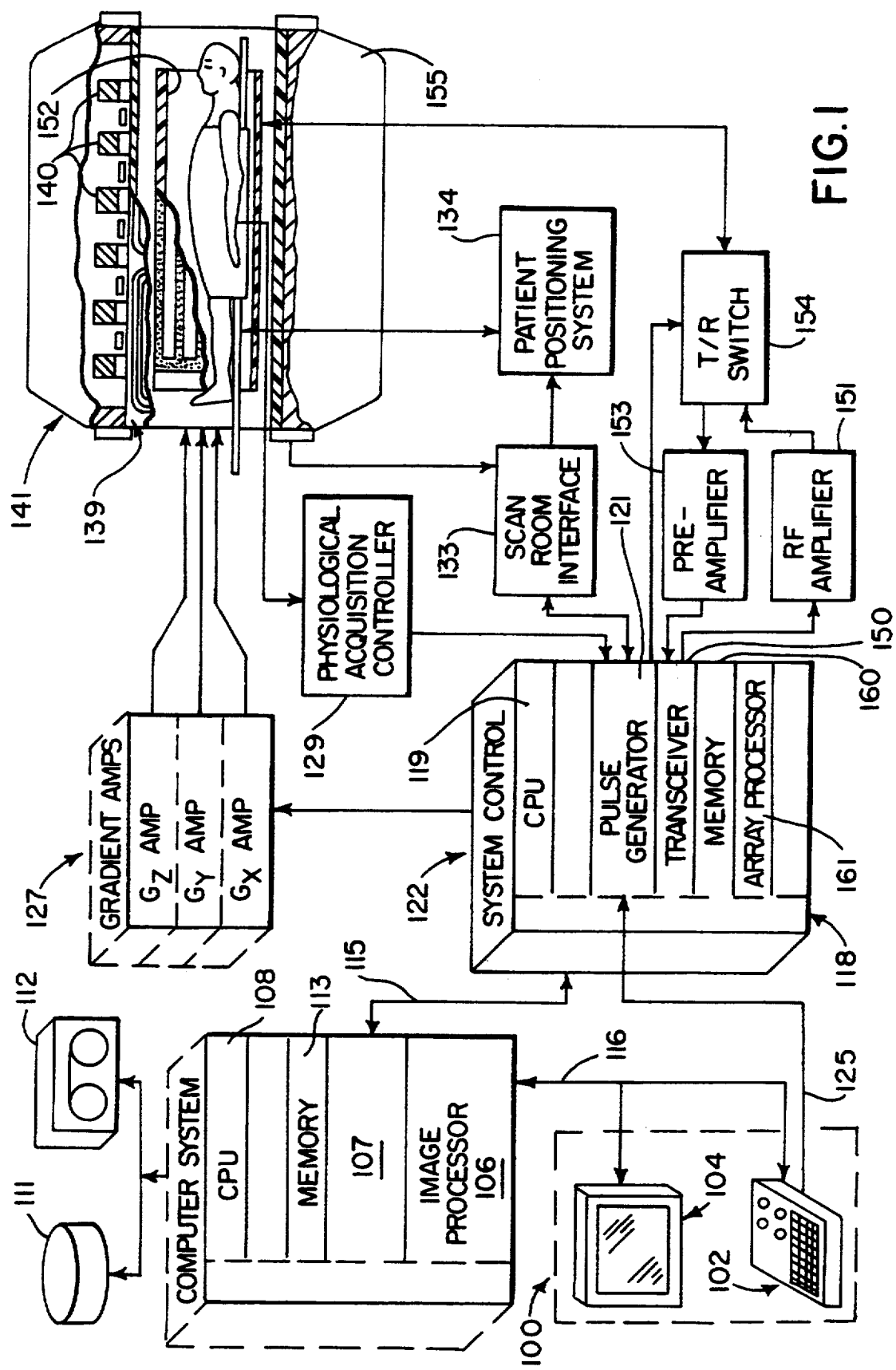
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_x$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104. For a more detailed description of the transceiver 150, reference is made to U.S. Pat. Nos. 4,952,877 and 4,992,736 which are incorporated herein by reference.

Figure 2:
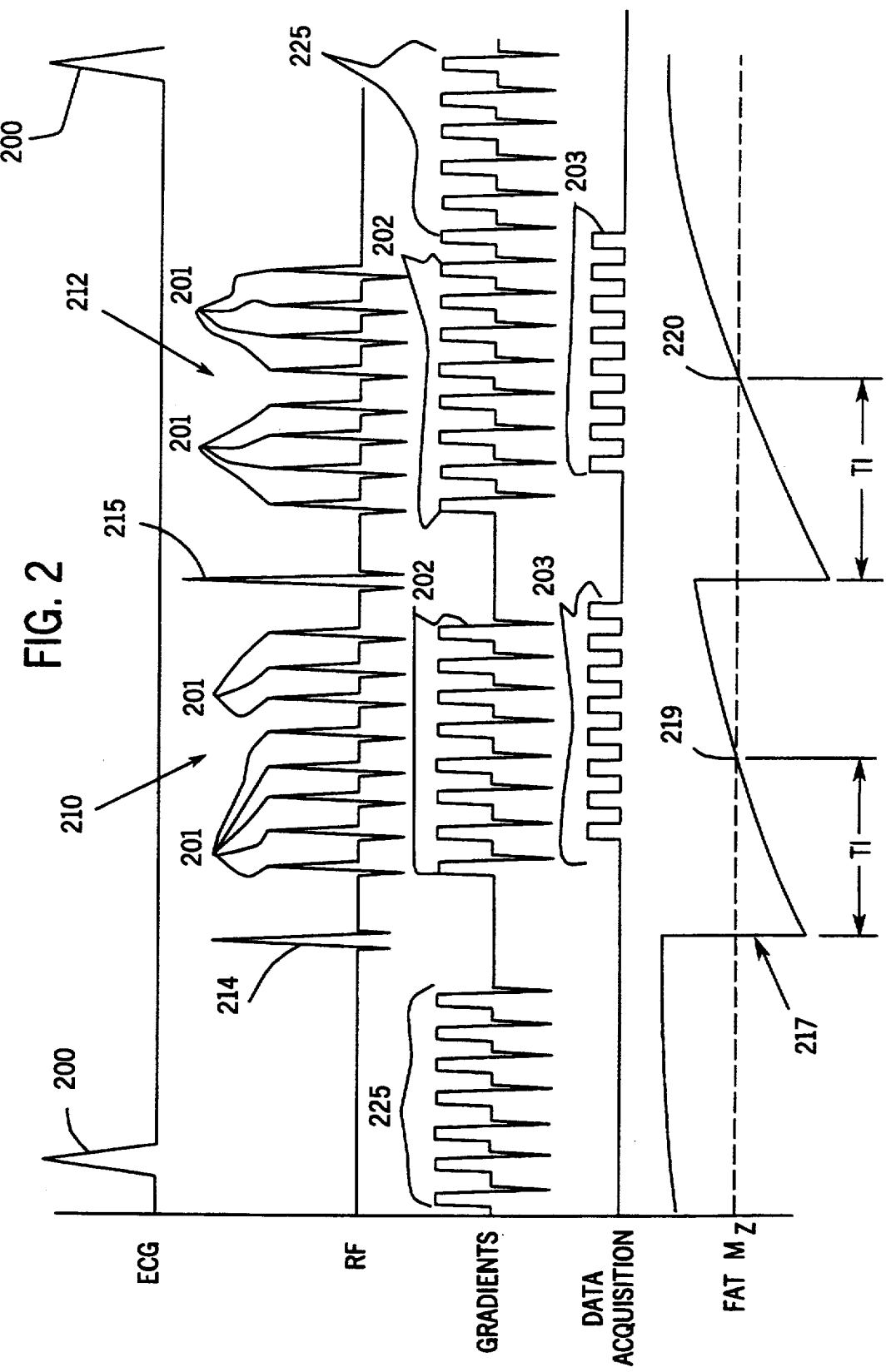
FIG. 2 is a graphic representation of the data acquisition sequence according to the present invention.

Referring particularly to FIG. 2, the cardiac acquisition in accordance with the preferred embodiment employs a series of fast gradient echo pulse sequences, with the repetition time (TR) of each gradient echo pulse sequence of between 6 and 15 ms, depending on the type of gradient hardware available and imaging parameters chosen. These pulse sequences are executed during the interval between the cardiac trigger signals 200 referred to as the R-R interval. The length of the R-R interval is a function of the patient's heart rate.

In a fast cardiac acquisition, the R-R interval is divided up into many short segments, with each segment being a fast gradient acquisition pulse sequence having an RF excitation field pulse 201, gradient pulses 202 and data acquisition window 203. Each RF excitation pulse 201 has a nominal flip angle of between 20°-30°, but which is precisely determined as will be described in detail below. Each fast gradient echo segment acquires an NMR signal during the window 203 representing a single line of k-space which is sometimes referred to as a view. Adjacent fast gradient echo segments are further combined into groups of n views where the data from each group contributes to generating an image at different temporal phases of the cardiac cycle (R-R interval). The temporal location of these phase images depends on the relative time from the cardiac trigger (R-wave) 200 to the center of each group of fast gradient echo segments. In FIG. 2, the first group of n view segments form the group 210 which acquires views for a first cardiac phase imaged, and the next group of n fast gradient echo view segments form the group 212 which acquires views for a second cardiac phase image.

The number of cardiac phases imaged during an acquisition depends on the number of groups of n view segments which can fit into the patient's R-R interval. Eight (n=8) fast gradient echo view segments are nominally chosen to constitute a group as this provides a compromise between the motion averaged temporal resolution of each image (defined as the time needed to acquire data from a group of n view segments), and the total image acquisition time. As 128 views are nominally required to form a complete image, using n=8 segments per group means that 8 views of k-space are acquired per phase image per cardiac trigger. Hence, 16 cardiac triggers are needed to complete the data acquisition, a time which is within the ability of most patients to maintain a breath-hold.

After 16 heart beats all 128 views are acquired and each k-space data set is then employed to reconstruct an image by performing a two-dimensional Fourier transformation as is well known to those skilled in the art. The resulting images depict the heart at two successive phases of the cardiac cycle.

Referring still to FIG. 2, fat suppression is achieved by adding a spectrally selective RF inversion pulse 214, 215 prior to each group 210, 212 of n=8 segments. The RF inversion pulses 210 and 212 employed in the preferred embodiment are spectrally shaped to invert only the fat protons, while spins associated with other tissues are substantially unaffected. The longitudinal magnetization $M_z$ of fat is indicated by the curve 217, and it can be seen that the magnetization $M_z$ passes through zero at 219 and 220, which are aligned at the centers of the respective groups 210 and 212. As a result, the fat spins will produce minimal signals during the acquisition of image data. Crusher gradients (not shown in the drawings) are applied after the spectrally selective RF inversion pulse 214, 215 to disperse any residual transverse magnetization resulting therefrom.

It is a discovery of the present invention that the first RF inversion pulse 214 should produce a smaller flip angle than subsequent RF inversion pulses 215 in the same cardiac cycle if the inversion recovery time (TI) is to be maintained at a minimum. As shown by the curve 217, the reason for this difference is that the longitudinal magnetization $M_z$ has a longer recovery period during the interval following the last RF pulse of the previous cardiac cycle and the magnetization equilibrium value $M_{eq}$ when the first RF inversion pulse 214 is applied is much greater than that when the second RF inversion pulse 215 is applied. The flip angle required to suppress fat signals is calculated as follows:

$$\theta = \cos^{-1}\left(\frac{-M_0(1 - \exp(-TI/T_1))}{\exp(-TI/T_1) \cdot (M_0 - (M_0 - M_{eq})\exp(-TR_{eff}/T_1))}\right) \quad (1)$$

where $M_0$ is the value of the equilibrium magnetization, $T_1$ is the relaxation constant for fat spins, $TR_{eff}$ is the effective TR time measured from the peak of the last RF excitation pulse in the previous cardiac cycle to the peak of the first spectrally selective RF inversion pulse, TI is the interval between the peak of the RF inversion pulse and the point where $M_z$ crosses zero, and $M_{eq}$ is the equilibrium magnetization after the last RF inversion pulse from the previous cardiac cycle is applied. In one embodiment, the effective TR time ($TR_{eff}$) is approximately 410 msecs for the first RF inversion pulse 214 for an operator-selected delay of 250 msec, if a heart rate of 70 bpm is assumed. On the other hand, $TR_{eff}$ for the subsequent RF inversion pulse 215 is only 18.7 msecs. To maintain a uniform inversion recovery time of 44 msecs., the flip angle ($\alpha$) for the first RF inversion pulse 214 need only be 120°, whereas the flip angle of any subsequent RF inversion pulse 215 in the same cardiac cycle is 180°.

Figure 3:
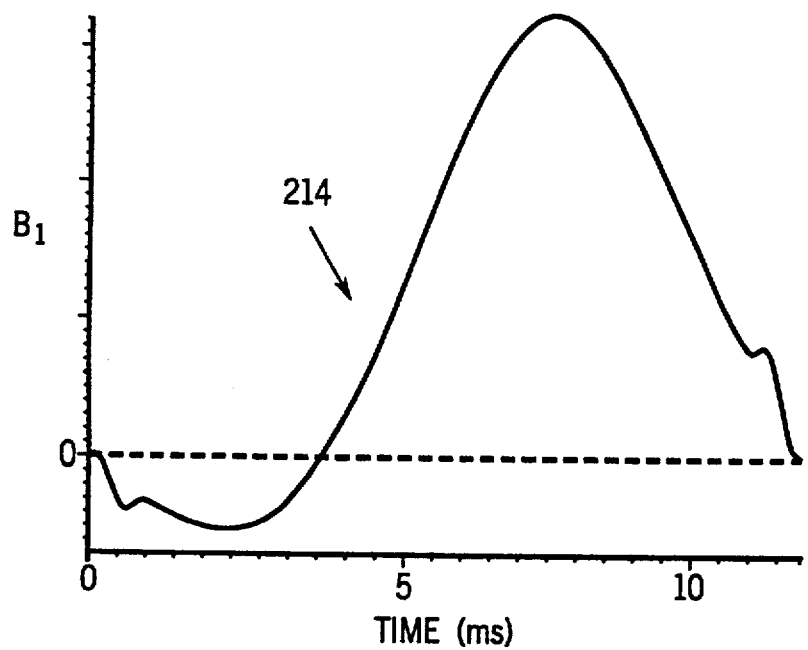
FIGS. 3 and 4 are modulation profiles of RF inversion pulses employed in the sequence of FIG. 2.
Figure 4:
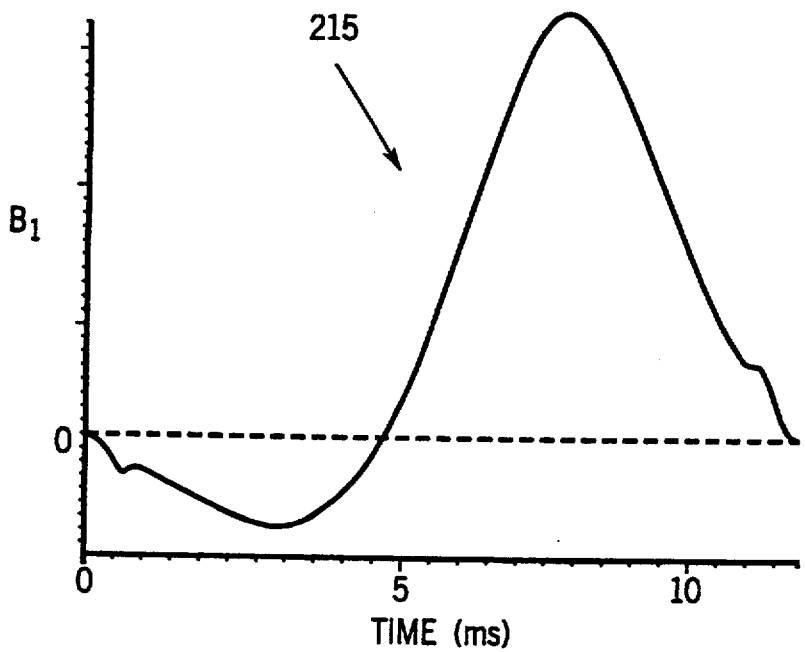

Referring to FIGS. 3 and 4, the spectrally selective RF inversion pulses 214 and 215 were designed using the method described in U.S. Pat. No. 4,940,940, issued Jul. 10, 1990 and entitled "Method Of Radio-Frequency Excitation In An NMR Experiment" which is incorporated herein by reference. They each have a duration of 12 msecs. and a bandwidth of 200 Hz centered on the fat resonance. The profile of the 120° RF inversion pulse 214 played out by the transceiver module 150 (FIG. 1) is shown in FIG. 3, and the profile of the 180° RF inversion pulse 215 is shown in FIG. 4. The use of these spectrally selective RF inversion pulses 214 and 215 provides better than 90% suppression of the NMR signal produced by fat.

As described in U.S. Pat. No. 5,256,967, issued on Oct. 26, 1993 and entitled "Fast NMR Image Acquisition With Spectrally Selective Inversion Pulses", when a selective RF inversion pulse is employed prior to a series of fast gradient echo pulse sequences, the longitudinal magnetization is not stable and so-called "disdaq", or dummy RF excitation pulse sequences are executed for a short period of time to promote stability before NMR data is acquired. A disdaq pulse sequence is a fast gradient echo pulse sequence in which no NMR data is acquired, and four such pulse sequences are typically executed. Since each group of pulse sequences 210 and 212 only includes eight data collection pulse sequences, the use of four disdaq would decrease the number of temporal cardiac phase images by nearly 50%. This is unacceptable when more than one cardiac phase image is to be acquired in a single breath-hold.

The need for disdaqs has been eliminated in the preferred embodiment of the invention by varying the flip angle of the RF excitation pulses 201 in each group 210 and 212 to ameliorate the effects of magnetization instability. In addition, the view acquisition order is altered to reduce any resulting image artifacts in the reconstructed image. The first method presumes a knowledge of how the magnetization fluctuates and compensates for these fluctuations by an offsetting variation in the RF pulse flip angle $\alpha$. The flip angles for the RF excitation pulses 201 are calculated starting with the last pulse in the group (n=8) and iteratively calculating the flip angles $\alpha$ of each preceding RF excitation pulse using the following equation:

$$\alpha_{n-1} = \tan^{-1}\left(\frac{M_n \sin\alpha_n}{M_n - M_0(1 - e^{-TR/T_1})}\right)$$

where
$M_n = M_{eq}$ at the completion of the group (0.6 in the preferred embodiment)
$M_o$ = equilibrium magnetization (usually 1.0)
TR = sequence repetition time (usually 8–14 msec)
$T_1$ = relaxation constant (300,000 μsec in the preferred embodiment).

To improve stabilization of the magnetization, a target flip angle of 30° is assigned to the n+2 RF excitation pulse and then the flip angles of the n+1, n, n−1, ... 2, and 1 RF excitation pulses are calculated from the above equation. In the preferred embodiment the flip angles for the n=8 RF excitation pulse 201 in each group 210 and 212 with a target flip angle of α=30° are as follows:

| Group 210 | | Group 212 | |
|---|---|---|---|
| n | α | n | α |
| 1 | 19.8 | 1 | 19.8 |
| 2 | 20.4 | 2 | 20.4 |
| 3 | 21.2 | 3 | 21.2 |
| 4 | 22.0 | 4 | 22.0 |
| 5 | 23.0 | 5 | 23.0 |
| 6 | 24.2 | 6 | 24.2 |
| 7 | 25.7 | 7 | 25.7 |
| 8 | 27.6 | 8 | 27.6 |

The second step employed to reduce the effects of magnetization instability is to alter the view acquisition order to an offset segmented interleaved view order. In a conventional interleaved acquisition order, there is an abrupt discontinuity at the center of k-space ($k_y=0$) where the value of the applied phase encoding gradient pulse is minimal. If the view acquisition order is offset, however, such that all the central k-space views are acquired at the same time after the RF inversion pulse, their signals will be equally "weighted" despite variations in magnetization. Since the central views have the greatest impact on the reconstructed image because they employ the lowest levels of phase encoding gradient pulses and have the highest signal power, image artifacts are minimized. For a non-offset interleaved acquisition, the view acquisition order for 128 views at n=8 views per cardiac cycle is:

| | | PULSE SEQUENCE NO. | | | | | | |
|---|---|---|---|---|---|---|---|---|
| | | 1 | 2 | 3 | 4 | 5 | 6 | 7 | 8 |
| CARDIAC | 0 | 1, | 17, | 33, | 49, | 65, | 81, | 97, | 113 |
| CYCLE | 1 | 2, | 18, | 34, | 50, | 66, | 82, | 98, | 114 |
| | 14 | 15, | 31, | 47, | 63, | 79, | 95, | 111, | 127 |
| | 15 | 16, | 32, | 48, | 64, | 80, | 96, | 112, | 128 |

There is a discontinuity at $k_y=0$ (views 64 and 65) as the views to the left and right of $k_y=0$ in which the phase encoding gradient pulse has its minimum values are acquired at different delay times relative to the preceding RF inversion pulse (214 or 215). This discontinuity is eliminated if the view acquisition order is offset as follows:

| | | PULSE SEQUENCE NUMBER | | | | | | |
|---|---|---|---|---|---|---|---|---|
| | | 1 | 2 | 3 | 4 | 5 | 6 | 7 | 8 |
| CARDIAC | 0 | 9, | 25, | 41, | 57, | 73, | 89, | 105 | 121 |
| CYCLE | 1 | 10, | 26, | 42, | 58, | 74, | 90, | 106, | 122 |
| | 7 | 16, | 30, | 48, | 64, | 80, | 96, | 112, | 128 |
| | 8 | 17, | 31, | 49, | 65, | 81, | 97, | 113, | 1 |
| | 14 | 23, | 39, | 55, | 71, | 89, | 103, | 119, | 7 |
| | 15 | 24, | 40, | 56, | 72, | 88, | 104, | 120, | 8 |

In this offset view order the central views (57-72) are all acquired by the fourth pulse sequence in each group 210 or 212. The magnetization appears substantially the same in each of these central views and the acquired data is thus equally weighted despite the magnetization variations that may be seen during the other "peripheral" views. In addition, the longitudinal magnetization of fat passes through zero near the fourth pulse sequence so that the effects of fat suppression are maximized in the reconstructed image.

Referring particularly to FIG. 2, following the cardiac trigger signal 200 there is an operator-selected delay of approximately 250 msecs before the RF associated with the first group 210 is applied, although a minimum delay of approximately 20-30 ms can also be used without loss of functionality. Similarly, after the RF pulses associated with the last group 212 are applied, the RF is turned off. These intervals in which no RF is applied enables the spin longitudinal magnetization to recover and increases the overall vascular signal-to-noise. However, it is a teaching of the present invention that during these magnetization recovery periods the gradient waveforms 202 continue to be applied as indicated at 225. While only the slice select gradient waveforms are illustrated in FIG. 2, it can be appreciated by those skilled in the art that the readout and view encoding gradient waveforms (not shown) should also be continued. It has been discovered that eddy currents induced in conductive structures by the gradient fields impose phase errors in the acquired NMR signals. If these phase errors differ substantially from view-to-view, image artifacts are produced in the reconstructed image. By applying the gradient waveforms 225 during the magnetization recovery period, the eddy currents are maintained in a steady state and the resulting phase errors remain relatively constant during the acquisition of all views. Image artifacts are thus reduced.

It should be apparent to those skilled in the art that the reduced time needed to acquire a fat suppressed data segment when the present invention is employed enables an increased number of temporal cardiac phase images to be acquired during a single breath-hold. This number can be further increased by sharing data acquired for different temporal cardiac phase images as disclosed in the above-cited co-pending U.S. patent application Ser. No. 102,166.

I claim:

1. A method for acquiring NMR data from a patient during a succession of cardiac cycles from which a plurality of cardiac phase images can be reconstructed, the steps comprising:
   a) producing a cardiac signal which indicates cardiac phase of the patient during each cardiac cycle;
   b) applying to the patient in timed relation with the cardiac signal a first, frequency selective, RF inversion pulse tuned to fat and having a first flip angle;
   c) applying a first group of NMR pulse sequences and acquiring NMR data for a first cardiac phase image during an interval following the first frequency selective, RF inversion pulse in which NMR signals produced by fat are minimal;
   d) applying to the patient in timed relation with the cardiac signal a second, frequency selective, RF inversion pulse tuned to fat and having a second flip angle;
   e) applying a second group of NMR pulse sequences and acquiring NMR data for a second cardiac phase image during an interval following the second frequency selective, RF inversion pulse in which NMR signals produced by fat are minimal;

wherein the first flip angle of the first frequency selective, RF inversion pulse is substantially less than the second flip angle of the second frequency selective, RF inversion pulse.

2. The method as recited in claim 1 in which the flip angle of the second frequency selective, RF inversion pulse is approximately 180°, and the flip angle of the first frequency selective, RF inversion pulse is approximately 120°.

3. The method as recited in claim 1 in which the NMR pulse sequences are fast gradient echo pulse sequences.

4. The method as recited in claim 1 in which each group of NMR pulse sequences includes eight NMR pulse sequences that acquire eight separate NMR signals.

5. The method as recited in claim 1 in which each NMR pulse sequence in each of said groups of NMR pulse sequences includes an RF excitation pulse having a flip angle, and further includes applying each RF excitation pulse to the patient and separately acquiring a NMR signal as a result of the applied RF excitation pulse.

6. The method as recited in claim 5 which includes separately determining the flip angle of each RF excitation pulse such that the acquired NMR signals have amplitudes which are substantially independent of fluctuations in longitudinal magnetization.

7. The method as recited in claim 5 in which each NMR pulse sequence in each of said groups of NMR pulse sequences includes applying to the patient a magnetic field gradient pulse that position encodes the acquired NMR signal, and further applying magnetic field gradient pulses to the patient during intervals of the cardiac cycle during which no NMR data is acquired.

8. The method as recited in claim 5 which includes reconstructing a first cardiac phase image using the NMR data acquired by said first group of NMR pulse sequences over a plurality of successive cardiac cycles.

9. The method as recited in claim 8 which includes applying a phase encoding gradient pulse during each NMR pulse sequence having a value ranging from low levels for central views to high levels for peripheral views.

10. The method as recited in claim 9 which includes ordering the views such that a set of central views are acquired by the same NMR pulse sequence in each of a succession of cardiac cycles.

11. The method as recited in claim 1 which includes repeating steps d) and e) as many times as possible within the cardiac cycle to acquire NMR data for additional cardiac phase images.

* * * * *